US008024626B2

(12) United States Patent
Adams et al.

(10) Patent No.: US 8,024,626 B2
(45) Date of Patent: *Sep. 20, 2011

(54) AUTOMATION OF FUSE COMPRESSION FOR AN ASIC DESIGN SYSTEM

(75) Inventors: Janice M. Adams, Jericho, VT (US);
Frank O. Distler, Williston, VT (US);
Mark F. Ollive, Milton, VT (US);
Michael R. Ouellette, Westford, VT (US); Jeannie H. Panner, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 1347 days.

This patent is subject to a terminal disclaimer.

(21) Appl. No.: 11/552,166

(22) Filed: Oct. 24, 2006

(65) Prior Publication Data
US 2007/0047343 A1 Mar. 1, 2007

Related U.S. Application Data

(62) Division of application No. 10/303,444, filed on Nov. 22, 2002, now Pat. No. 7,174,486.

(51) Int. Cl.
*G11C 29/00* (2006.01)
(52) U.S. Cl. ........................ 714/710; 714/733
(58) Field of Classification Search .................. 714/710, 714/733
See application file for complete search history.

(56) References Cited

U.S. PATENT DOCUMENTS

| 4,718,065 | A |   | 1/1988  | Boyle et al. |
| 5,005,158 | A | * | 4/1991  | McClure et al. ............ 365/200 |
| 5,077,736 | A | * | 12/1991 | Dunphy et al. ............... 714/7 |
| 5,255,226 | A |   | 10/1993 | Ohno et al. |
| 5,357,473 | A | * | 10/1994 | Mizuno et al. ............ 365/201 |
| 6,026,224 | A | * | 2/2000  | Darden et al. .............. 716/10 |
| 6,275,963 | B1|   | 8/2001  | Maeno et al. |
| 6,469,932 | B2| * | 10/2002 | Roohparvar et al. .... 365/185.09 |
| 6,757,204 | B2|   | 6/2004  | DiRonza et al. |

* cited by examiner

*Primary Examiner* — M. Mujtaba K Chaudry
(74) *Attorney, Agent, or Firm* — Schmeiser, Olsen & Watts; David Cain

(57) ABSTRACT

A method and system for repairing defective memory in a semiconductor chip. The chip has memory locations, redundant memory, and a central location for ordered fuses. The ordered fuses identify in compressed format defective sections of the memory locations. The defective sections are replaceable by sections of the redundant memory. The ordered fuses have an associated a fuse bit pattern of bits which sequentially represents the defective sections in the compressed format. The method and system determines the order in which the memory locations are wired together; designs a shift register of latches through the memory locations in accordance with the order in which the memory locations are wired together; and associates each of the latches with a corresponding bit of an uncompressed bit pattern from which the fuse bit pattern is derived. The uncompressed bit pattern comprises a sequence of bits, representing the defective sections in uncompressed format.

26 Claims, 12 Drawing Sheets

FIG. 9

Example of a Fuse Location Dataset (FLD)

```
begin_instructions
FUSE_ALGORITHM FUSE_SHIFT_REG
PINNAME_SREG FUSEOUT
KEY DECOMP
COMPRESSION_ALGORITHM DECOMP_64
FUSE_WORDS 64
end_instructions
begin_xy_locations
```

| * | X | Y | Identifier |
|---|---|---|---|
|   | 2.100 | 7.900 | word0bit0 |
|   | 2.200 | 7.800 | word0bit1 |
|   | 2.300 | 7.700 | word0bit2 |
|   | ........ | ........ | ........ |
|   | 2.400 | 7.600 | word0bit11 |
|   | 2.500 | 7.500 | word1bit11 |
|   | ........ | ........ | ........ |
|   | 2.700 | 7.200 | word63bit11 |

```
end_xy_locations
```

FIG. 10

Example of a Latch Location Dataset (LLD) For an eDRAM

```
eDRAM follows.
        begin_instructions
        KEY EDRAM
        SIZE 2
        REPAIR_ALGORITHM EDRAM1
        PINNAME_SREG FUSEOUT
        end_instructions
```

FIG. 11

Example of a Latch Location Dataset (LLD) For a SRAM

```
begin_instructions
KEY MABIST
PINNAME_PF PASSFAIL
PINNAME_SREG FUSEOUT
end_instructions
begin_latches
* SRAM Shift Register Latch Name      Controller Latch Name
            FUSESRL0            FUSES1_00_RWLOA00.LATCH2;
            FUSESRL1            FUSES1_01_RWLOA01.LATCH2;
            FUSESRL2            FUSES1_02_RWLOA02.LATCH2;
            FUSESRL3            FUSES1_03_RWLOA03.LATCH2;
            FUSESRL4            FUSES1_04_RWLOA04.LATCH2;
            FUSESRL5            FUSES1_05_RWLOA05.LATCH2;
            FUSESRL6            FUSES1_06_RWLOA06.LATCH2;
            FUSESRL7            FUSES1_07_RWLOA07.LATCH2;
            ........                    ........
            FUSESRL79           FUSES2_79_RWL3_EN.LATCH2;
            ........                    ........
end_latches
```

FIG. 12A

Example of a LPXREF Dataset: Fuse Portion

```
SECTION FUSE_SHIFT_REG.
/*      Notes:                                                   */
/*      - No ECID in the Fuse Compression Macro                  */
/*                                                               */
/*                      Decomp Macro                             */
/*              Instance                        Compression      */
/*      Key     Name            Cell Name       Algorithm        */
/*      -----   --------        ---------       ---------        */
        DECOMP  Decomp0         DecompCell      Decomp_64;
/*      The following is in order such that the first fuse will be shifted */
/*      first into the scan chain....                            */
/*                                                               */
/*      Key             Idenifier       x               y        */
/*      -----           --------        ------          ------   */
/* First PROM                                                    */
        FUSE            word0bit0       2002.10         117.90;
        FUSE            word0bit1       2002.20         117.80;
        FUSE            word0bit2       2002.30         117.70;
                            ⋮
        FUSE            word0bit11      2002.40         117.60;
        FUSE            word1bit0       2002.50         117.50;
                            ⋮
        FUSE            word1bit11      2002.60         117.40;
        FUSE            word63bit0      2002.70         117.30·
                            ⋮
        FUSE            word63bit11     2002.70         117.20;
/* Second PROM                                                   */
        FUSE            word64bit0      3280.40         456.60;
                            ⋮
        FUSE            word64bit11     3280.45         456.65;
        FUSE            word65bit0      3280.50         456.50;
                            ⋮
        FUSE            word65bit11     3280.60         456.40:
                            ⋮
        FUSE            word127bit0     3280.70         456.30
                            ⋮
        FUSE            word127bit11    3290.70         456.20
```

FIG. 12B

Example of a LPXREF Dataset: Memory Portion

```
/* The following is in order such that the first RAM latch is closest to the    */
/* fuse compression macro...                                                    */
/*                                                                              */
/*         Controller Inst.                                                     */
/* Key     Passfail PinName   SRAM Latch Inst. Name   Controller Latch Instance Name  */
/*-----------------------------------------------------------------------------*/
   MABIST  INSTANCE_C.PF00    INSTANCE_S1.FUSESRL0    INSTANCE_C.FUSES1_00-RWLOA00.LATCH2;
   MABIST  INSTANCE_C.PF00    INSTANCE_S1.FUSESRL1    INSTANCE_C.FUSES1_01-RWLOA01.LATCH2;
   MABIST  INSTANCE_C.PF00    INSTANCE_S1.FUSESRL2    INSTANCE_C.FUSES1_02-RWLOA02.LATCH2;
   MABIST  INSTANCE_C.PF00    INSTANCE_S1.FUSESRL3    INSTANCE_C.FUSES1_03-RWLOA03.LATCH2;
   MABIST  INSTANCE_C.PF00    INSTANCE_S1.FUSESRL4    INSTANCE_C.FUSES1_04-RWLOA04.LATCH2;
   MABIST  INSTANCE_C.PF00    INSTANCE_S1.FUSESRL5    INSTANCE_C.FUSES1_05-RWLOA05.LATCH2;
   MABIST  INSTANCE_C.PF00    INSTANCE_S1.FUSESRL6    INSTANCE_C.FUSES1_06-RWLOA06.LATCH2;
   MABIST  INSTANCE_C.PF00    INSTANCE_S1.FUSESRL7    INSTANCE_C.FUSES1_07-RWLOA07.LATCH2;
     .        .                   .                      .
     .        .                   .                      .
     .        .                   .                      .
   MABIST  INSTANCE_C.PF01    INSTANCE_S2.FUSESRL79   INSTANCE_C.FUSES2_79_RWL3_EN..LATCH2;
/*                                                                              */
/*         DRAM                                                                 */
/*         Instance                            Repair                           */
/* Key     Name          Cell Name    Size    Algorithm                         */
/* -----   ---------     ----------   ----    ---------                         */
   EDRAM   Macro0        2MegMacro     2      EDRAM1;
```

US 8,024,626 B2

AUTOMATION OF FUSE COMPRESSION FOR AN ASIC DESIGN SYSTEM

This application is a divisional of Ser. No. 10/303,444, filed Nov. 22, 2002 now U.S. Pat. No. 7,174,486, issued Feb. 6, 2007.

BACKGROUND OF THE INVENTION

1. Technical Field

The present invention relates to a method and system for improving automation of the fuse blow procedure and the associated memory repairs in relation to a determination, through testing, of the defective sections of memory of a semiconductor chip of an application specific integrated circuit (ASIC) design.

2. Related Art

An application specific integrated circuit (ASIC) may include a semiconductor chip, wherein the chip includes memory devices such as random access memory (RAM). Examples of RAM devices include static random access memory (SRAM) and embedded dynamic random access memory (eDRAM). Since these memory devices are subject to failure they may be tested, such as by use of a built-in self-test (BIST) design, so that defective sections of memory can be subsequently switched out and replaced by redundant memory that had been reserved for repairing said defective sections of memory. The chip may contain an array of fuses and upon detection of a defective memory section, select fuses of the array of fuses may be blown to encode within the hardware of the chip the defective sections of memory so determined by the testing. When the chip is subsequently powered up, the array of blown and unblown fuses may be used to identify the defective sections of memory so that the defective sections of memory may be logically disconnected from the chip circuitry in favor of the redundant memory.

Unfortunately, the use of fuses for replacing defective memory with redundant memory is not currently optimal with respect automation of the fuse blow procedure and the associated memory repairs. Thus, there is a need to improve automation of the fuse blow procedure and the associated memory repairs.

SUMMARY OF THE INVENTION

The present invention provides a method for enabling a repair of defective memory in an integrated circuit design, said design having memory locations, redundant memory, and a central location for ordered fuses adapted to identify in compressed format defective sections of each of the memory locations, said defective sections adapted to be replaced by sections of the redundant memory, said ordered fuses having a fuse bit pattern, said fuse bit pattern sequentially representing said defective sections in said compressed format, said method comprising:

determining the order in which the memory locations are wired together;

designing a shift register of latches through the memory locations in accordance with said order; and associating each of the latches with a corresponding bit of an uncompressed bit pattern from which said fuse bit pattern is derived, said uncompressed bit pattern sequentially representing said defective sections in uncompressed format.

The present invention provides a system for enabling a repair of defective memory in an integrated circuit design, said design having memory locations, redundant memory, and a central location for ordered fuses adapted to identify in compressed format defective sections of each of the memory locations, said defective sections adapted to be replaced by sections of the redundant memory, said ordered fuses having a fuse bit pattern, said fuse bit pattern sequentially representing said defective sections in said compressed format, said system comprising:

a shift register of latches through the memory locations in accordance with an order in which the memory locations are wired together, wherein each latch of the shift register is associated with a sequentially corresponding bit of an uncompressed bit pattern from which the fuse bit pattern is derived, said uncompressed bit pattern sequentially representing said defective sections in uncompressed format.

The present invention provides a method and system for improving automation of the fuse blow procedure and the associated memory repairs in relation to a determination, through testing, of the defective sections of memory of a semiconductor chip of an application specific integrated circuit (ASIC) design.

BRIEF DESCRIPTION OF THE DRAWINGS

FIG. 9 depicts an example of a Fuse Location Dataset (LLD), in accordance with embodiments of the present invention.

FIG. 10 depicts an example of a Latch Location Dataset (LLD) for an eDRAM, in accordance with embodiments of the present invention.

FIG. 11 depicts an example of a Latch Location Dataset (LLD) for a SRAM, in accordance with embodiments of the present invention.

FIG. 12A depicts an example of the fuse portion of a LPXREF Dataset, in accordance with embodiments of the present invention.

FIG. 12B depicts an example of the memory portion of the LPXREF Dataset of FIG. 12A, in accordance with embodiments of the present invention.

DETAILED DESCRIPTION OF THE INVENTION

FIGS. 1-11, 12A, and 12B relate to a method and system for enabling a repair of defective memory in an integrated circuit design of an application specific integrated circuit (ASIC) design. The chip has memory locations, redundant memory, and a central location for ordered fuses. The ordered fuses are adapted to identify in compressed format defective sections of each of the memory locations. The defective sections are adapted to be replaced by sections of the redundant memory. For example, a defective row of memory cells may be replaced with a redundant row of memory cells by programming ordered fuses with the defective row's address, such that whenever the defective row's address is specified by the system, the redundant row of memory cells will be accessed rather than the original defective row of memory cells. The fuse bit pattern sequentially represents the defective sections in the compressed format.

The method embodied by FIGS. 1-11, 12A, and 12B: determines the order in which the memory locations are wired together; designs a shift register of latches chained through the memory locations in accordance with the order in which the memory locations are wired together; and associates each of the latches with a corresponding bit of an uncompressed bit pattern from which the fuse bit pattern is derived. The uncompressed bit pattern comprises a sequence of bits, called "address bits", representing the defective sections in uncompressed format. The system embodied by FIGS. 1-8 includes the shift register.

Figure 1:
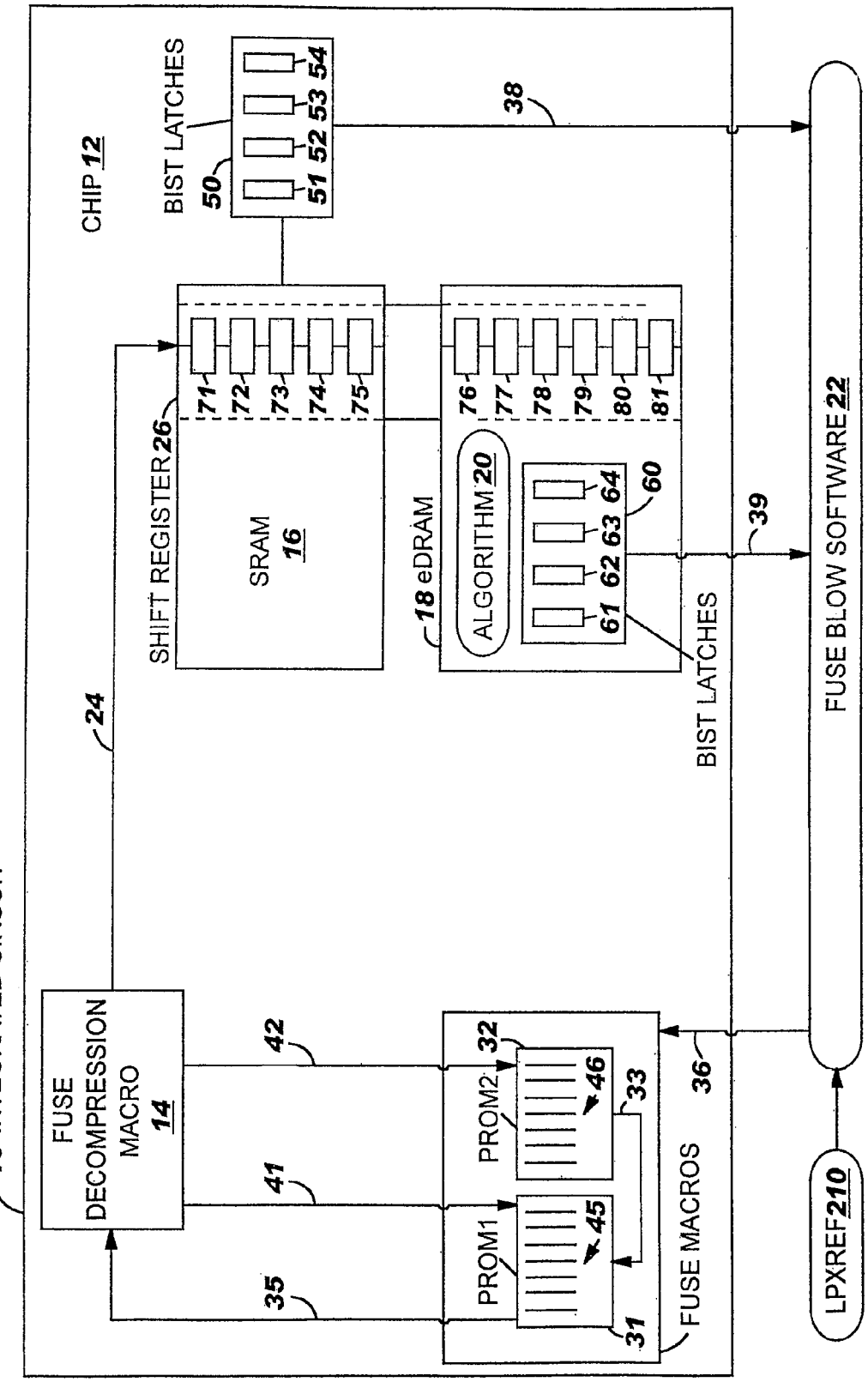
FIG. 1 illustrates a block diagram of a semiconductor chip having random access memories (RAMs) and associated built-in self test (BIST) latches, fuse macros, a shift register having latches chained through the RAMs, said chip being coupled to fuse blow software having an input dataset (LPXREF dataset), in accordance with embodiments of the present invention.

FIG. 1 illustrates a block diagram of a semiconductor chip 12 of an integrated circuit 10 of an ASIC design, in accordance with embodiments of the present invention. The chip 12 comprises fuse macros 31 and 32, a fuse decompression macro 14, a static random access memory (SRAM) 16, a group 50 of built-in self test (BIST) latches 51, 52, 53, 54 . . . associated with and coupled to the SRAM 16, an embedded dynamic random access memory (eDRAM) 18, a group 60 of BIST latches 61, 62, 63, 64 . . . internally located within the eDRAM 18, and a shift register 26 comprising random access memory (RAM) latches 71, 72, 73, 74, 75, . . . and 76, 77, 78, 79, 80, 81, . . . chained sequentially through the SRAM 16 and eDRAM 18, respectively, in accordance with a sequential wiring path through the SRAM 16 and eDRAM 18 as shown. Although FIG. 1 shows only the one SRAM 16 and the one eDRAM 18, the chip 12 may comprise any number of SRAMs and any number of eDRAMs wired together in any sequence, such that the RAM latches of the shift register 26 are chained sequentially through all of such RAMs in accordance with the sequential wiring path through all of such RAMs.

The BIST latches 51, 52, 53, 54, . . . associated with the SRAM 16 may be located outside the SRAM 16 and store binary bit portions of defective memory addresses existing within the SRAM 16 as a result of the BIST testing of the memory within the SRAM 16, as is known by a person of ordinary skill in the art. Each additional SRAM (not shown in FIG. 1) of the chip 12 has a similarly associated group of BIST latches which store binary bit portions of defective addresses within the additional SRAM. Similarly, the BIST latches 61, 62, 63, 64, . . . within the eDRAM 18 store binary bit portions of defective memory addresses existing within the eDRAM 18 as a result of the BIST testing of the memory of the SRAM 16, as is known by a person of ordinary skill in the art. Each additional eDRAM (not shown in FIG. 1) of the chip 12 comprises within itself a similar group of BIST latches which store binary bit portions of defective addresses within the additional eDRAM.

FIG. 1 also shows fuse blow software 22 coupled to the chip 12, and a logical-to-physical cross reference (LPXREF) dataset 210 coupled to fuse blow software 22, in accordance with embodiments of the present invention. A "dataset" is defined herein, including in the claims, as any organized data structure for storing data such as, inter alia, a file, a plurality of files, a table, a plurality of tables a database or portion thereof (such as a table or group of tables of a database which can be a relational database, a flat database, etc.), encoded data within a computer program or software, etc. The fuse blow software 22 is also coupled to the BIST latches 51, 52, 53, 54, . . . of the SRAM 16 via path 38, and to the BIST latches 61, 62, 63, 64, . . . of the eDRAM 18 via path 39. The fuse blow software 22 controls blowing (i.e., burning such as with a laser) the pertinent fuses of the fuse macros 31 and 32, and communicates with the fuse macros 31 and 32 via path 36.

The LPXREF dataset 210 comprises input data to the fuse blow software 22 for identifying the array of fuses 45 and array of fuses 46 of the fuse macros 31 and 32, respectively, and also for denoting the spatial locations where said arrays of fuses 45 and 46 are located. The LPXREF dataset 210 also comprises input data that facilitates forming an uncompressed bit pattern, namely a sequence of address bits extracted from the latches of the BIST latch group 50 associated with the SRAM 16 and the latches of the BIST latch group 60 contained within the eDRAM 18. The uncompressed bit pattern identifies in uncompressed format failed memory addresses of the SRAM 16 and eDRAM 18, respectively, as deduced from testing the memory of the SRAM 16 and eDRAM 18. The sequence of address bits of the uncompressed bit pattern is ordered in accordance with the sequence of RAM latches 71, 72, 73, 74, 75, . . . and 76, 77, 78, 79, 80, 81, . . . in the shift register 26. The sequence of address bits of the uncompressed bit pattern is adapted to be subsequently compressed into the fuse bit pattern encoded within the arrays of fuses 45 and 46 of the fuse macros 31 and 32, respectively. Proper sequencing of the bits in the uncompressed bit pattern is facilitated through an association within the LPXREF dataset 210 of a unique BIST latch of BIST latches 51-54, . . . 61-64, . . . with each of RAM latches 71-75, . . . , 76-81, . . . as will be described infra. The uncompressed bit pattern is subsequently compressed into the fuse bit pattern, which represents in compressed format the defective memory addresses of the SRAM 16 and eDRAM 18.

The fuse macros 31 and 32 are in a central logical location on the chip 12 (i.e., the fuse macros 31 and 32 may be located in scattered or diverse physical locations on the chip 12), such that they may be readily accessed by the fuse decompression macro 14 and are located in programmable read-only memory (PROM), namely in PROM1 and PROM2 respectively. The fuse macros 31 and 32 each comprise an ordered array of fuses 45 and 46, respectively. While FIG. 1 shows only two fuse macros 31 and 32, the chip 12 may generally comprise at least one such fuse macro (i.e., one fuse macro, two fuse macros, or more than two fuse macros). The arrays of fuses 45 and 46 of the fuse macros 31 and 32, respectively, are burnt in a way that represents, in compressed format, defective portions of memory locations on the chip 12, such as defective portions of the SRAM 16 and eDRAM 18. Each fuse of the arrays of fuses 45 and 46 may represent a 1 if burnt and 0 if not burnt, or alternatively each fuse of the arrays of fuses 45 and 46 may represent a 0 if burnt and 1 if not burnt. The bits represented by the burnt and un-burnt fuses are called fuse bits and the sequence of such fuse bits, ordered in accordance with the ordering of their respective fuses, is the fuse bit pattern that represents in compressed format the defective portions of memory of the SRAM 16 and eDRAM 18.

Figure 3:
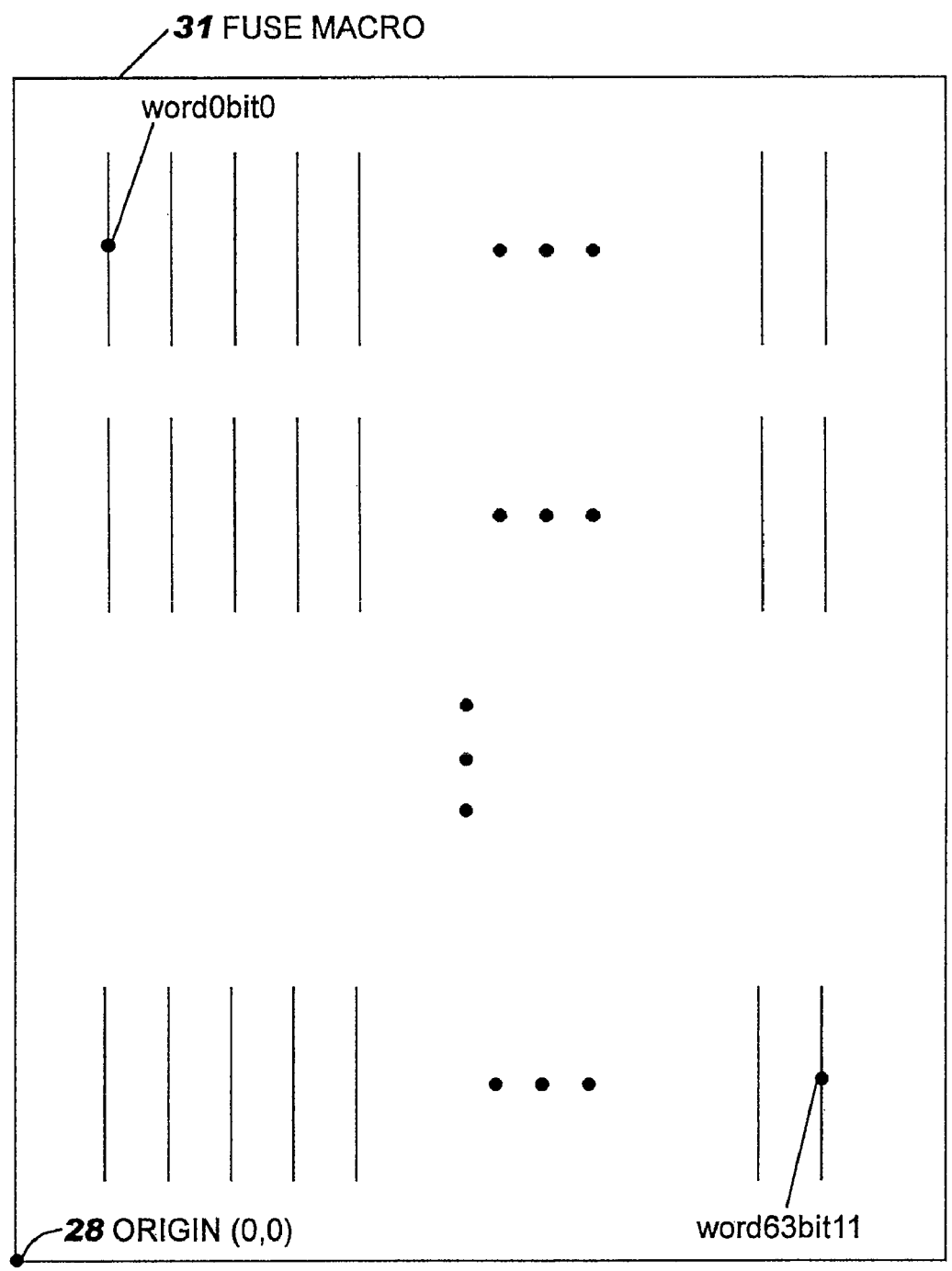
FIG. 3 illustrates an example of a fuse macro of FIG. 1, in accordance with embodiments of the present invention.

FIG. 3 illustrates an example of the fuse macro 31 of FIG. 1, in accordance with embodiments of the present invention. The ordered array of fuses 45 (see FIG. 1) in the fuse macro 31 represents a fuse bit pattern of bits as a compressed string representing defective memory. In FIG. 3, the fuses and associated fuse bit pattern is represented by up to sixty-four (i.e., 64) 12-bit words, wherein each such bit (i.e., fuse bit) is represented by one fuse. The 12-bit word is in a compressed format in accordance with any compression scheme known to a person of ordinary skill in the art. A noteworthy example of fuse compression is disclosed in the currently filed United States Patent application entitled "Method and Apparatus For Initializing an Integrated Circuit Using Compressed Data From a Remote Fusebox," filed Dec. 5, 2000 and identified as application Ser. No. 09/731,147, hereby incorporated by reference herein in its entirety.

A useful compression scheme for the present invention may comprise within itself a code for decompression of itself. As an example, the first bit of the 12-bit word may indicate whether or not the 12-bit word represents compression. If the first bit of the 12-bit word is 0, then the 12-bit word comprises uncompressed bits and, accordingly, bits 2-12 of the 12-bit word are shifted out during decompression of the fuse bit pattern. For example, if the 12-bit word is 010010010010, then the bits 10010010010, which represent a defective memory address, are to be so shifted out. If the first bit of the 12-bit word is 1, then the 12-bit word may represent compressed address data for unselected redundant memory locations (uncompressed long string of "0"s) or compressed address data for selected column redundancy (uncompressed long string of "1"s), wherein the second bit of the 12-bit word indicates the bit (1 or 0) to be shifted out during decompression of the fuse bit array, and bits 3-12 of the 12-bit word represents the number of such bits (i.e., the second bit of the 12-bit word) to be shifted out during decompression of the fuse bit array. For example, if the 12-bit word is 101111111110, then 1022 zeroes are to be shifted out since 1111111110 is a binary representation of 1022 in decimal.

Each fuse bit in the fuse macro 31 of FIG. 3 has an identifier and a spatial location relative to the fuse macro origin 28. The identifiers are word0bit0, word0bit1, . . . , word0bit11 for the first word of the fuse macro 31, . . . , and word63bit0, word63bit1, . . . , word63bit11 for the 64th word of the fuse macro 31. The fuse bits in the embodiment of FIG. 3 are represented two-dimensionally by two (e.g., X-Y) coordinates but may alternatively be represented three-dimensionally by three (e.g., X-Y-Z) coordinates.

Returning to FIG. 1, the group 50 of BIST latches comprises BIST latches 51, 52, 53, 54, . . . which store binary bit portions of defective addresses within the SRAM 16, said binary bit portions of defective addresses being determined from BIST testing of the addresses of the SRAM 16 in accordance, with test procedures known to one of ordinary skill in the art. The group 50 of BIST latches is located external to the SRAM 16 and comprises any number of such latches (even though only four such BIST latches 51-54 are explicitly shown in FIG. 1) as needed to describe up to a prescribed maximum number of defective addresses in the SRAM 16. The group 50 of BIST latches is coupled to the fuse blow software 22 via path 38, since the fuse blow software 22 needs to access the group 50 of BIST latches to read the contents of the latches of the BIST latches 51, 52, 53, 54, . . . in order to determine which fuses of arrays of fuses 45 and 46 to blow to correctly describe defective memory addresses of the SRAM 16. The scheme for determining which fuses of the arrays of fuses 45 and 46 to blow relates to the ordering of RAM latches 71, 72, 73, 74, 75 . . . within the SRAM 16, and the correspondence between the RAM latches 71, 72, 73, 74, 75 . . . and the BIST latches 51, 52, 53, 54, . . . that is included within the LPXREF dataset 210. Each such RAM latch is associated with a unique BIST latch relating to the SRAM 16.

The actual number of such RAM latches within the SRAM 16 depends on the maximum number of redundant rows of memory cells that have been reserved for the SRAM 16. For example, if the SRAM 16 has 4 redundant rows of memory cells, and if the address of each defective row of addresses is characterized by 10 bits (e.g., 1 enable bit and 9 address bits) that identifies the address of a defective row that is replaceable by a redundant row, then the SRAM 16 will have an associated 40 latches in the shift register 26 (i.e., 4 redundant rows multiplied by 10 address bits per defective row to be replaced by a redundant row). In this example, each of four sequences of 10 latches in the shift register 26 drives a word line that accesses a row of redundant addresses in the SRAM 16. Each such sequence of 10 latches identifies the address of a word line that accesses a row of defective addresses, as derived from BIST latches in the SRAM 16. Thus, each such sequence of 10 latches enables said row of redundant addresses to replace said row of defective addresses, by swapping in the word line that accesses the row of redundant addresses for the word line that accesses the row of defective addresses. Generally, each RAM latch in the portion of the shift register 26 that is within the first SRAM 16 is adapted to subsequently receive the address bit that is stored in its associated unique BIST latch. For notational convenience, the term "defective address(es)" is defined herein to mean "address(es) of defective memory cells".

In FIG. 1, the eDRAM 18 comprises a group 60 of BIST latches 61, 62, 63, 64, . . . which store binary bit portions of the addresses of defective memory cells within the eDRAM 18, said binary bit portions of defective addresses being determined from BIST testing of the memory cells of the eDRAM 18. In contrast with the BIST latches 51, 52, 53, 54, . . . of the SRAM 16, the BIST latches 61, 62, 63, 64, . . . are internal to the eDRAM 18 and comprise any number of such latches (even though only four such BIST latches 61-64 are explicitly shown in FIG. 1) as needed to describe up to a prescribed maximum number of defective addresses in the eDRAM 18. The BIST latches 61, 62, 63, 64, . . . are coupled to the fuse blow software 22 via path 39, since the fuse blow software 22 needs to access the BIST latches 61, 62, 63, 64, . . . to read the contents of the latches of the group 60 in order to determine which fuses of arrays of fuses 45 and 46 to blow to correctly describe defective addresses of the eDRAM 18. The scheme for determining which fuses of the arrays of fuses 45 and 46 to blow relates to the ordering of latches RAM 76, 77, 78, 79, 80, 81, . . . within the eDRAM 18, and the correspondence between the RAM latches 76, 77, 78, 79, 80, 81, . . . and the BIST latches 61, 62, 63, 64, . . . in accordance with the algorithm 20, as will be described infra.

The actual number of such RAM latches within the eDRAM 18 depends on the maximum number of redundant rows and columns of memory cells that have been reserved for the eDRAM 18. For example, if the eDRAM 18 has 5 redundant rows of memory cells, and if each defective row of memory cells is characterized by 10 bits (1 enable bit and 9 address bits) that identifies the address of a defective row which is replaceable by a redundant row, then the eDRAM 18 will have an associated 50 latches in the shift register 26 (i.e., 5 redundant rows multiplied by 10 address bits per defective row that to be replaced by a redundant row). In this example, each of five sequences of 10 latches in the in the shift register 26 drives a word line that accesses a row of redundant memory cells in the eDRAM 18. Each such sequence of 10 latches identifies the address of a word line that accesses a row of defective memory cells, as derived from BIST latches in the eDRAM 18. Thus, each such sequence of 10 latches enables said row of redundant memory cells to replace said row of defective memory cells, by swapping in the word line that accesses the row of redundant memory cells for the word line that accesses the row of defective memory cells.

The preceding discussion shows that for a given RAM (e.g., the SRAM 16 or eDRAM 18) each set of sequential latches (e.g., 10 latches) in the portion of the shift register 26 that passes through the given RAM drives specific word lines that accesses rows of redundant memory cells for the given RAM. However, there is a unique set of BIST latches associated with the given RAM, wherein said unique BIST latches identify (through BIST testing) failed addresses of word lines which must be swapped in favor of said specific redundant word lines. Thus said unique BIST latches of the given RAM must be paired with corresponding RAM latches in the shift register 26. The LPXREF dataset 210 specifies said pairing of BIST latches with said corresponding RAM latches of each RAM of the chip 12.

In relation to FIG. 1 when the chip 12 is powered up, the fuse decompression macro 14 decompresses the fuse bit pattern that is encoded into the arrays of fuses 45 and 46 of the fuse macros 31 and 32. Said decompression generates a decompressed bit pattern which effectively restores the uncompressed bit pattern that had been previously compressed into the fuse bit pattern. The bits of the decompressed bit pattern are sequentially transferred into the RAM latches 71, 72, 73, 74, 75, ..., 76, 77, 78, 79, 80, 81, ... of the shift register 26, such that the first bit shifted out of the decompressed bit pattern is ultimately shifted into the furthermost RAM latch (e.g., latch 81 in FIG. 1) from the fuse decompression macro 14.

The sequence of fuse bits shifted out of the fuse macros 31 and 32 is effectuated by select lines 41 and 42. First, select line 41 is turned on (while select line 42 is turned off) so that the fuse bits associated with the array of fuses 45 are sequentially passed into the fuse decompression macro 14 via path 35. After all fuse bits associated with fuse macro 31 have been passed to the fuse decompression macro 14, then the select line 41 is turned off and the select line 42 is turned on, which causes the fuse bits associated with array of fuses 46 of fuse macro 32 to be sent to the fuse decompression macro 14 by being passed over path 33 to the fuse macro 31 and then over path 35 into the fuse decompression macro 14.

As described, the fuse bit pattern in the fuses of the arrays of fuses 45 and 46 stores in hardware (i.e., in the fuse macros 31 and 32) the failed memory addresses of the RAMs of the chip 12 in compressed format. When the chip 12 is powered up, said failed memory addresses of the RAMs of the chip 12 are converted to a decompressed by the fuse decompression macro 14 as described supra, and then shifted into RAM latches 71, 72, 73, 74, 75, ..., 76, 77, 78, 79, 80, 81, ... of the shift register 26.

Figure 2:
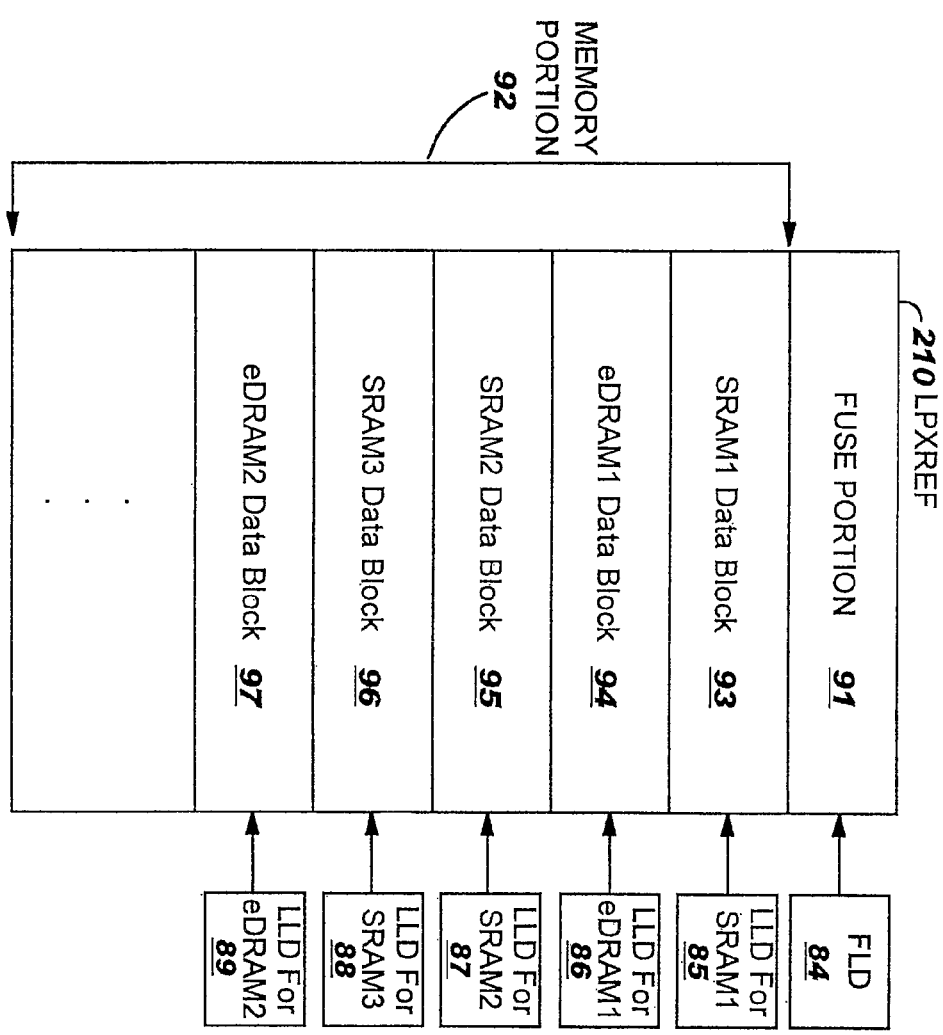
FIG. 2 depicts a map of the input dataset of FIG. 1, in accordance with embodiments of the present invention.

FIG. 2 depicts a map of a LPXREF dataset 210, in accordance with embodiments of the present invention. The LPXREF dataset 210 is encoded with in computer readable memory (e.g., RAM, read-only memory (ROM), a hard disk drive, a floppy disk drive, an optical disc, etc.). The LPXREF dataset 210 comprises a fuse portion 91 and a memory portion 92. The fuse portion 91 may comprise a line of data for each fuse of the ordered array of fuses, including a fuse identifier and a spatial (e.g., X-Y) location for each said fuse. Each such line of data for said fuse is called a "fuse element" of the fuse portion 91, and the set of such lines of data is called an "array of fuse elements." The memory portion 92 comprises a sequence of memory data blocks, namely: a SRAM data block 93, an eDRAM data block 94, a SRAM2 data block 95, a SRAM3 data block 96, an eDRAM2 data block 97 ... in accordance with a corresponding wiring path through the RAMs: the SRAM data block 93, the eDRAM data block 94, the SRAM2 data block 95, the SRAM3 data block 96, the eDRAM2 data block 97, .... Thus each data block of the memory portion 92 of the LPXREF dataset 210 is associated with a unique RAM of the chip 12.

Each data block of the memory portion 92 that is associated with a SRAM comprises SRAM latch pointers and associated BIST latch pointers. The RAM latch pointers in a SRAM data block may be ordered in accordance with the chained sequence of the RAM latches within said SRAM. Each such SRAM latch pointer points to one of the RAM latches within the SRAM, and the associated BIST latch pointer points to the BIST latch that is uniquely associated with said one of the RAM latches. Said association between RAM latches and BIST latches facilitates placement of address bits of failed memory addresses within a sequence of address bits adapted to be compressed into a fuse bit pattern.

The BIST latches associated with an eDRAM may be located inside said eDRAM. A eDRAM data block within the memory portion 92 of the LPXREF dataset 210 comprises an identification of an algorithm (e.g., the algorithm 20 in the eDRAM 18 of FIG. 1) adapted to transfer the address bits stored in the BIST latches relating to said eDRAM into the RAM latches in said eDRAM. The eDRAM data block further comprises an identification of the memory size of the first eDRAM. Said algorithm 20 may utilize said memory size of the first eDRAM to transfer the address bits stored in the BIST latches relating to said eDRAM into the RAM latches in said eDRAM, so as to facilitate said placement of address bits of failed memory addresses into a sequence of address bits adapted to be compressed into a fuse bit pattern.

Individual datasets may serve as source datasets for the fuse portion 91 and the memory portion 92. In particular, a fuse location dataset (FLD) 84 is a source dataset for the fuse portion 91 of the LPXREF dataset 210. There is one FLD for each fuse macro in the chip 12. The FLD 84 is stored in a computer readable medium and is transferred into the fuse portion 91 of the LPXREF dataset 210. Latch location datasets (LLDs) 85, 86, 87, 88, and 89 are source datasets for each of: the SRAM1 data block 93, the eDRAM data block 94, the SRAM2 data block 95, the SRAM3 data block 96, and the eDRAM2 data block 97, respectively. Each of LLDs 85, 86, 87, 88, and 89 are stored in a computer readable medium and is adapted to be transferred into the memory portion of the LPXREF dataset 210. The LLD for a SRAM may comprise latch location (LL) data that includes the SRAM latch pointers and associated BIST latch pointers. The LLD for an eDRAM may comprise LL data that includes the identification of the algorithm (e.g., the algorithm 20 in the eDRAM 18 of FIG. 1) and the identification of the memory size of the eDRAM. Examples of the fuse portion 91 and memory portion 92 of the LPXREF 210, and examples of a corresponding FLD and LLD, will be presented infra.

Figure 4:
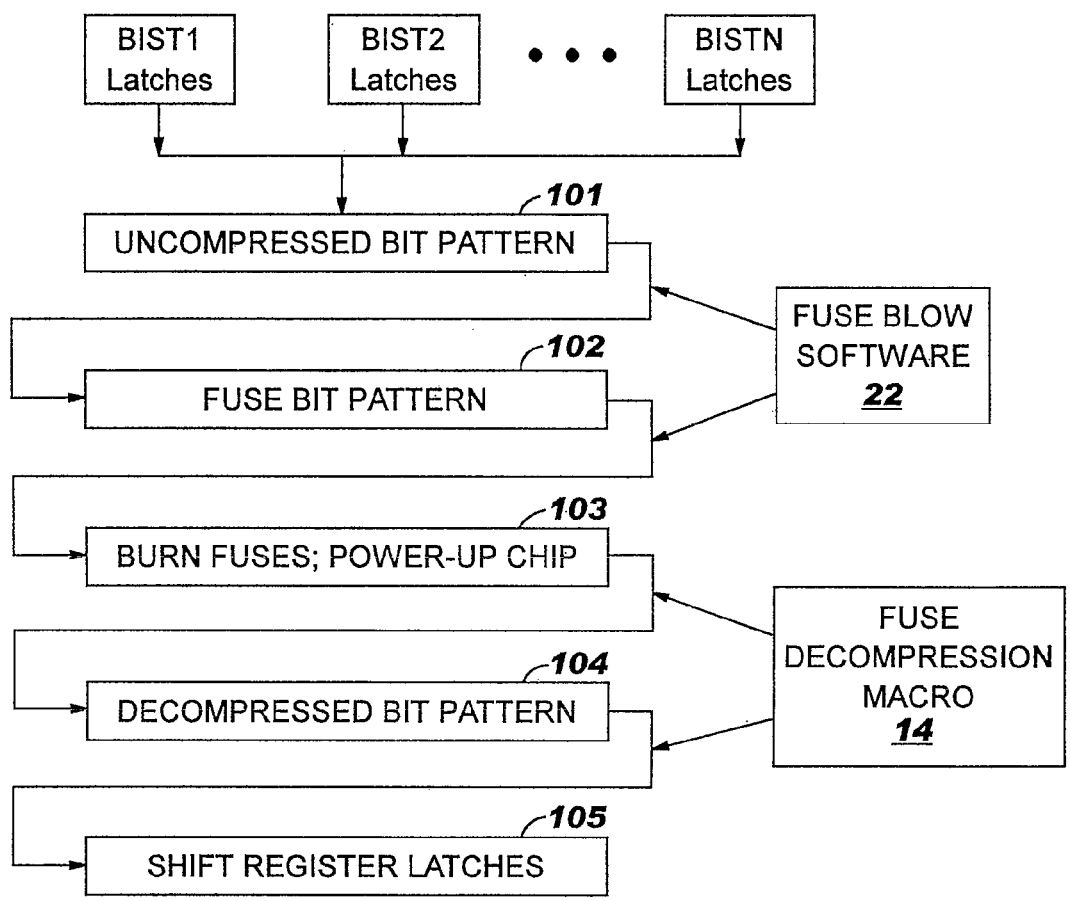
FIG. 4 is flow chart of bit pattern chronology for a semiconductor chip having multiple random access memories (RAMs) and associated built-in self test (BIST) latches, in accordance with embodiments of the present invention.

FIG. 4 is flow chart of bit pattern chronology for a semiconductor chip having N RAMs denoted as RAM 1, RAM 2, ..., RAMN having corresponding associated BIST1 latches, BIST2 latches, ..., BISTN latches, in accordance with embodiments of the present invention. The uncompressed bit pattern 101 comprises bits that describe defective memory addresses of RAM 1, RAM 2, ..., RAMN, and the bits of the uncompressed bit pattern 101 are derived from the BIST1 latches, BIST2 latches, ..., BISTN latches, from BIST testing of RAM 1, RAM 2, ..., RAMN. The fuse blow software 22 compresses the uncompressed bit pattern 101 into the compressed fuse bit pattern 102, and the fuse blow software 22 utilizes the compressed fuse bit pattern 102 to selectively burn fuses of the fuse macros (e.g., the fuses of the array of fuses 45 and 46 of the fuse macros 31 and 32, respectively, of FIG. 1). Upon powering up of the semiconductor chip, the fuse decompression macro 14 decompresses the fuse bit pattern 102 to generate a decompressed bit pattern 104 which includes the address bits of the uncompressed bit pattern 101 and is equivalent to the uncompressed bit pattern 101, but may be in a different format than that of the uncompressed bit pattern 101. The fuse decompression macro 14 also shifts out the decompressed bits of the decompressed bit pattern 104 into the shift register latches of a shift register (e.g., the shift register 26 of FIG. 1) that is chained sequentially through RAM 1, RAM 2, ..., RAMN.

Figure 5:
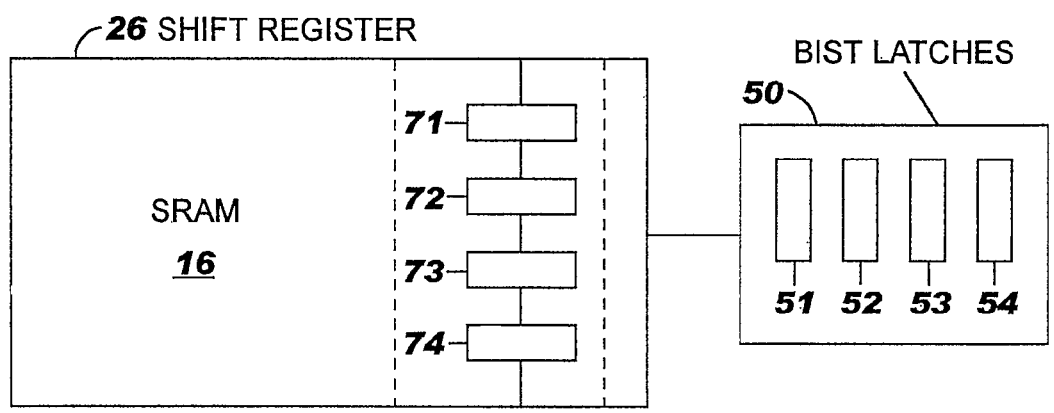
FIG. 5 depicts a correspondence between the latches of the shift register and BIST latches of a static random access memory (SRAM) of FIG. 1, in accordance with embodiments of the present invention.
Figure 5:
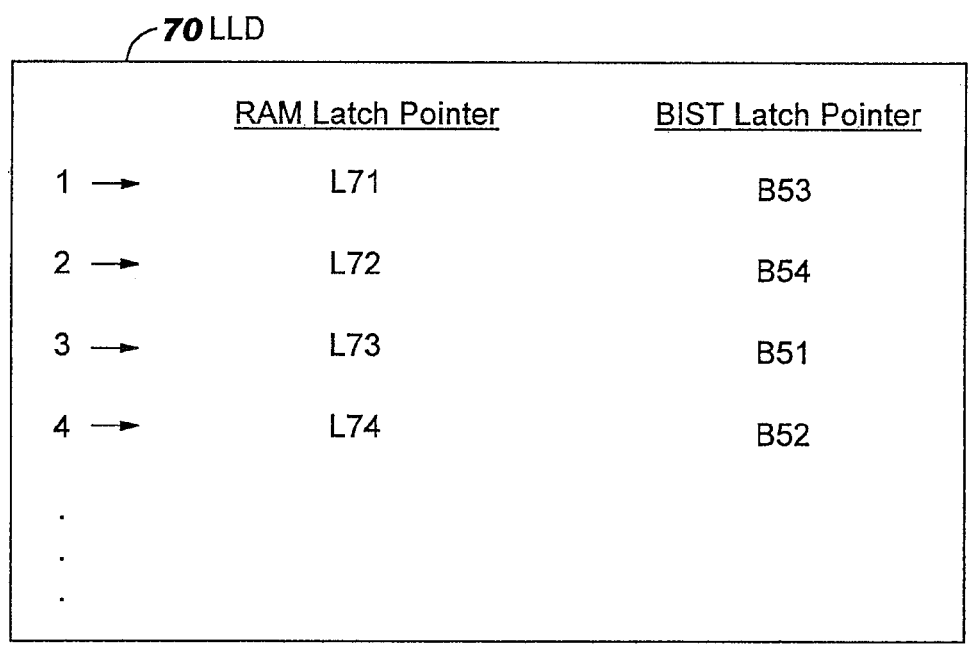

FIG. 5 depicts the correspondence between the RAM latches 71, 72, 73, 74, ... of the shift register 26 of the SRAM 16 and the BIST latches 51, 52, 53, 54, ... of the BIST latch group 50 (see FIG. 1), and the specification of said correspondence in a LLD 70, in accordance with embodiments of the present invention. Said correspondence in FIG. 5 is, as an example, that RAM latches 71, 72, 73, and 74 are associated respectively with BIST latches 53, 54, 51, and 52. Assuming that RAM latches 71, 72, 73, and 74 respectively have identifiers L71, L72. L73, and L74, and further assuming that BIST latches 51, 52, 53, and 54 respectively have identifiers B51, B52, B53, and B54, the LLD 70 shows that said association between RAM latches and corresponding BIST latches are expressed through the identifiers of said RAM latches and said BIST latches.

Figure 6:
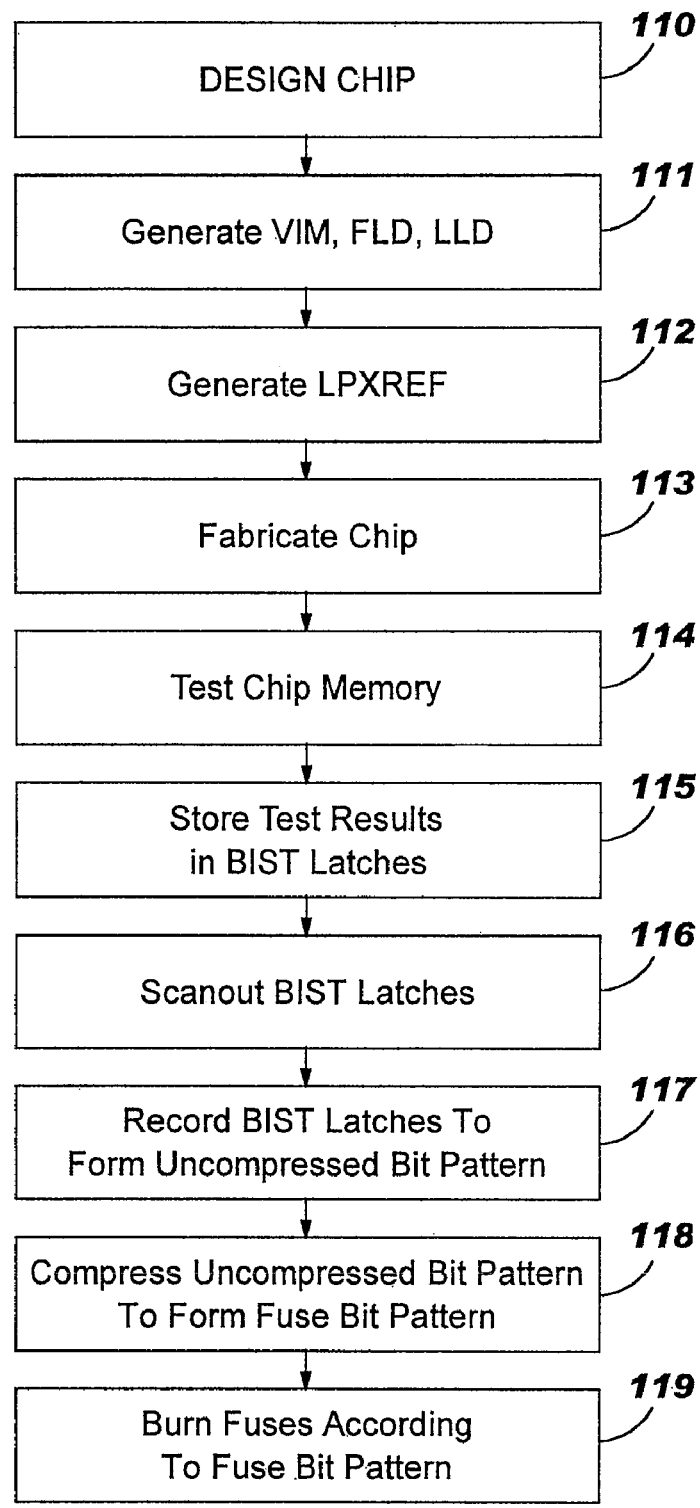
FIG. 6 depicts a sequence of steps from the semiconductor chip design to the burning of fuses, in accordance with embodiments of the present invention.

FIG. 6 depicts a sequence of steps 110-119 from the semiconductor chip design to the burning of fuses, in accordance with embodiments of the present invention. In step 110, the semiconductor chip is designed, which includes designing the nets of the chip and thus determining the order in which the RAMs and associated memory locations on the chip are wired together. Said designing also includes designing the shift register 26 (see FIG. 1) having latches extending through said RAMs and associated memory locations in accordance with the order in which the RAMs and associated memory locations are wired together. The designing also associates each of the RAM latches with a corresponding bit of the uncompressed bit pattern from which the fuse bit pattern will be derived (see FIG. 4 supra and accompanying description) as a result of the testing of chip memory of step 114 (described infra). The uncompressed bit pattern sequentially represents in uncompressed format the defective sections of memory that will be determined from the testing of chip memory in step 114. Step 111 generates a library comprising a Very-Large-Scale-Integration (VLSI) In-core Model (VIM). The VIM is the model of the ASIC design and comprises the netlists on the chip. Step 111 also generates the FLD and LLD datasets. Step 112 generates the LPXREF dataset 210 using the VIM, FLD, and LLD of step 111. The LPXREF dataset 210 implements associating each of the RAM latches with the corresponding bit of the uncompressed bit pattern from which the fuse bit pattern will be derived, as designed in step 110 which was discussed supra. Step 113 fabricates the chip compatibly with the VIM, FLD, and LLD. Step 114 tests the memory (e.g., SRAMs and eDRAMs) of the chip, such as via BIST testing. Step 115 stores the defective memory addresses, as identified in the testing of step 114, in the relevant BIST latches corresponding to each RAM. In step 116, the bits of the BIST latches are scanned out. In step 117, the scanout BIST latch data is reordered, using the LPXREF dataset 210, to form the uncompressed bit string of defective addresses, said scanning out being ordered in correspondence with the sequenced RAM latches in the shift register, wherein the correspondence between the sequenced RAM latches and associated BIST latches is used to generate the uncompressed bit string of address bits. In step 118, the uncompressed bit string of address bits is compressed to foam the fuse bit pattern. In step 119, the fuses are selectively burned in accordance with the fuse bit pattern such that the sequential ordering of the bits in the fuse bit pattern corresponds to the sequential ordering of fuses in the fuse portion of the LPXREF dataset 210. Upon powering up of the chip, the fuse bit pattern is decompressed to form a decompressed bit pattern and the RAM latches of the shift register are sequentially filled with the bits shifted out from the decompressed bit pattern. Thus, the sequential ordering of the bits in the decompressed bit string corresponds to the sequential ordering of the RAM latches in the shift register 26 (see FIG. 1).

Figure 7:
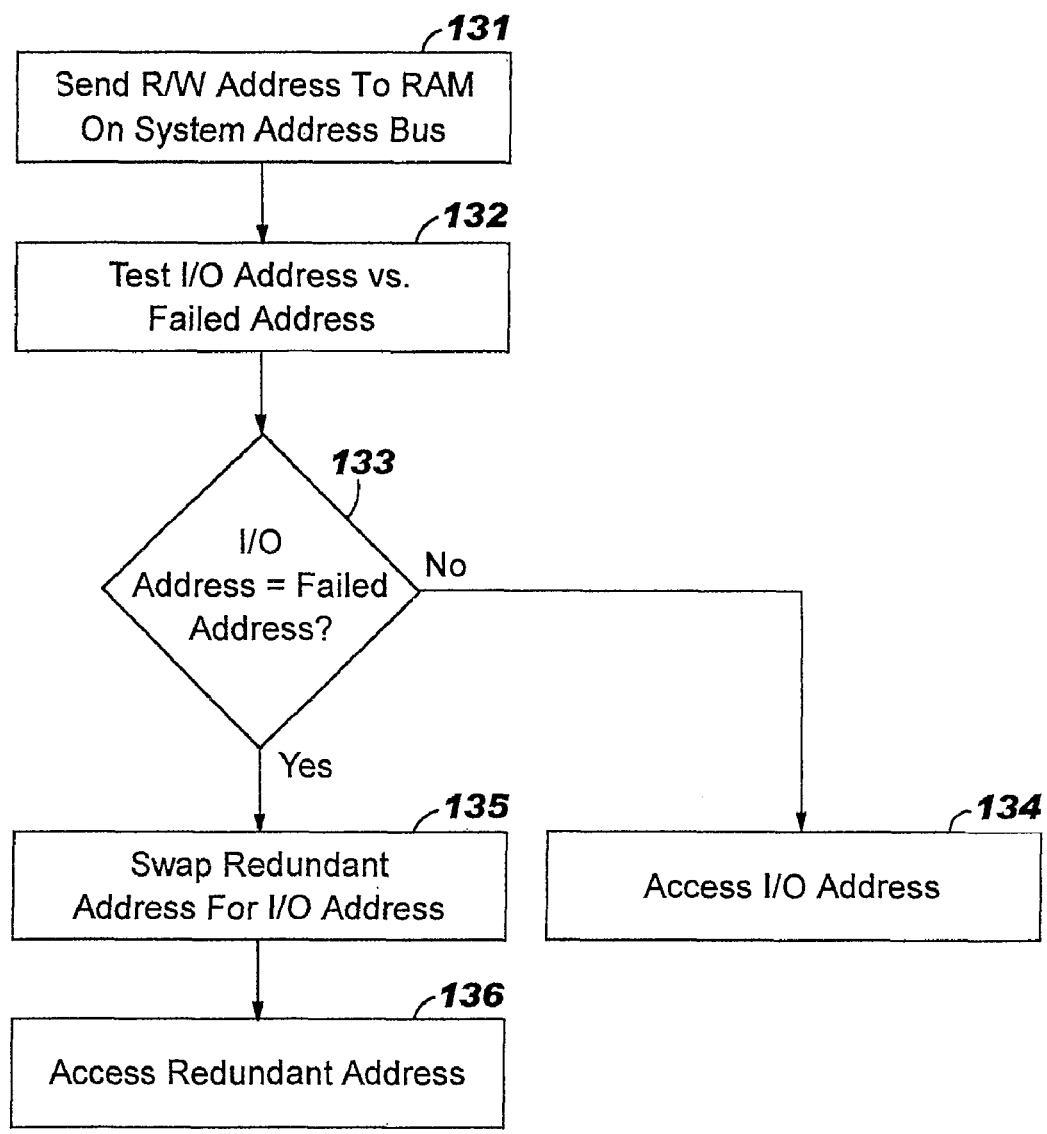
FIG. 7 is a flow chart showing replacement of a failed memory address in favor of a redundant memory address during use of the chip of FIG. 1, in accordance with embodiments of the present invention

FIG. 7 is a flow chart showing replacement of a failed memory address in favor of a redundant memory address during operation of the chip 12 of FIG. 1, in accordance with embodiments of the present invention. The flow chart of FIG. 7 comprises steps 131-136. In step 131, a read/write (R/W) address is sent to a RAM on a system address bus. In step 132, the I/O address is tested against the failed addresses stored in the shift register 26 (see FIG. 1). In step 133, a decision is made based whether the I/O address equals one of said failed addresses stored in the shift register 26. If the I/O address is not equal to one of said failed addresses, then the I/O address is accessed in step 134. If the I/O address is equal to one of said failed addresses, then step 135 is executed which swaps in the redundant address for the I/O address, wherein the redundant address is accessed by the word line that is associated with the bits in the shift register 26 that contains the one of said failed addresses. Step 136 accesses the redundant address instead of the I/O address.

What is unique to the automation of the fuse compression scheme, is the need to describe to the fuse test software the actual order of each ASIC design's fuse shift register (see, e.g., the shift register 26 of FIG. 1) which will "daisy-chain" throughout all of the redundancy-containing memory macros on the ASIC chip. Which memories, how many memories and in which order the shift register chains through said memories is ASIC design dependent, and will vary from one ASIC to the next. The ASIC chip test data can be automatically organized by the test software in an order which will match the ordering of latches in the shift register. The need to report this shift register ordering of latches is useful to the automation process. To that end, a memory design-specific rule type has been created for ASIC compilable memories. This rule is called the Latch Location Dataset (LLD), described supra. This dataset describes the correspondence between the BIST failing address register latches and the corresponding memory's shift register latches.

Once the fuse test data is organized to match the order in which the ASIC's shift register has been designed, the serial string test data is compressed according to any compression method known to a person of ordinary skill in the art. As an example, the compressed data may be organized as multiple data words each of which are 12 bits in width, as discussed supra. Each bit of all of the 12-bit data words corresponds to a physical fuse within the fuse macro. The word/bit identifier and the physical X-Y location of the fuse relative to the fuse macro origin is described in the fuse macro's Fuse Location Dataset (FLD). The FLD format allows the fuse X-Y location to be paired with a logical description of the fuse.

Figure 8:
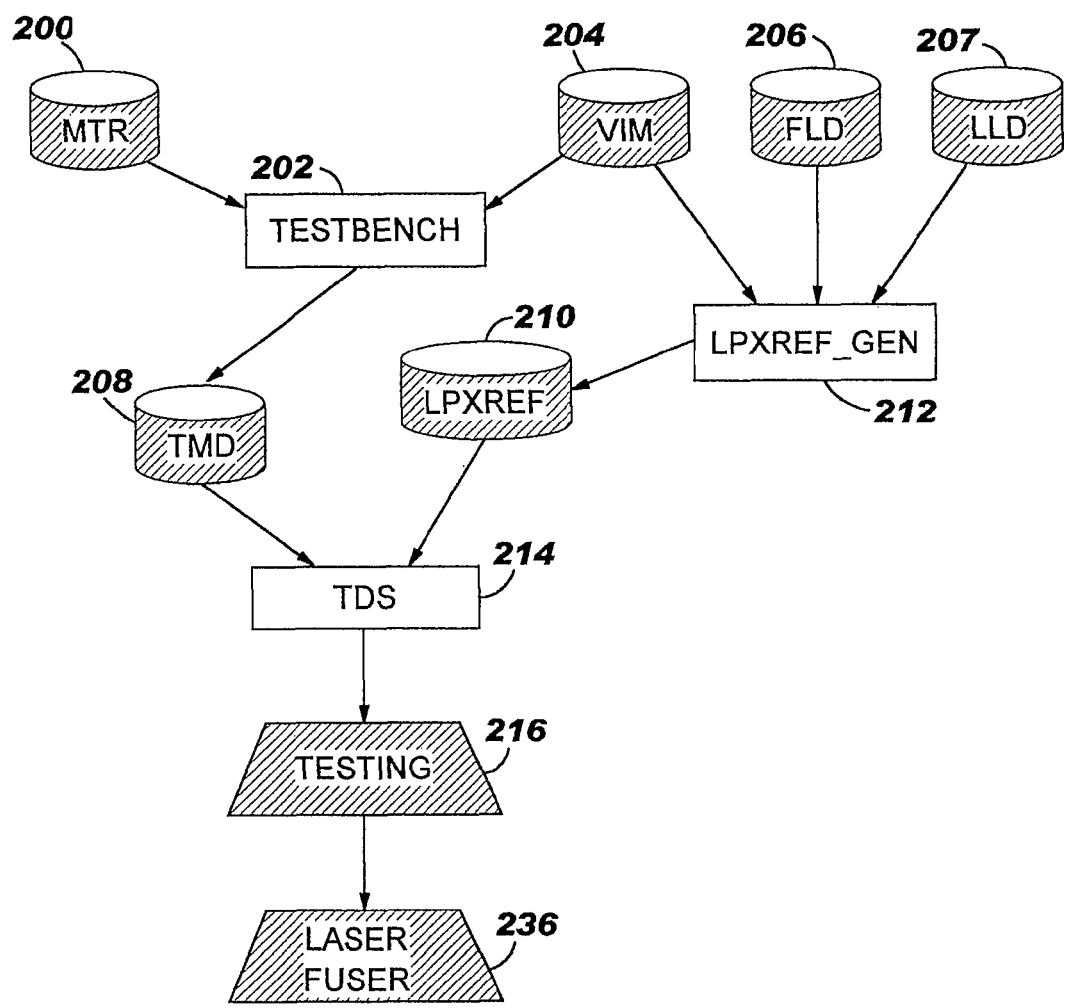
FIG. 8 depicts an automated system for blowing fuses of the fuse macros of a semiconductor chip, in accordance with embodiments of the present invention.

FIG. 8 depicts an automated system for blowing fuses of the fuse macros of a semiconductor chip, in accordance with embodiments of the present invention. Another automated system for blowing fuses is disclosed in the currently filed United States Patent application entitled "Automated Fuse Blow Software System," filed Oct. 5, 2000 and identified as application Ser. No. 09/680,340, hereby incorporated by reference herein in its entirety.

In FIG. 8, the Very-Large-Scale-Integration (VLSI) In-core Model (VIM) 204 contains the model of an ASIC design which includes a netlist and physical design data (e.g., placement of each cell instance). The VIM 204 can be organized in a flat or hierarchical manner. Within the VIM 204, there exists a logical instance of a fuse decompression macro (e.g., the fuse decompression macro 14 in FIG. 1) and one or more fuse PROMs connected to the fuse decompression macro.

A FLD 206 identifies fuses and their locations, as described supra. A LLD 207 describes as association between RAM latches in a shift register and BIST latches adapted to store bits of failed memory addresses, as described supra. The ASIC product's logic netlist in the VIM file 204, the FLD 206, and the LLD 207 supply information to a LPXREF_GEN generator (i.e., program) 212 for generating a LPXREF dataset 210. The LPXREF_GEN program 212 reads the ASIC design (VIM) and associated technology rules, including the FLD 206 and the LLD 207 to generate said LPXREF dataset 210. The LPXREF dataset 210 includes fuse identifier and location data as well as a description of the shift register latches chained through the memories, as described supra.

Test manufacturing data (TMD) 208 is generated for each ASIC product. The TMD 208 includes functional test patterns to run MABIST for SRAMs and BIST for eDRAMs. The TestBench application 202 generates the TMD 208 using the technology specific Macro Test Rule (MTR) 200. The TestBench application 202 provides an isolation solution for the MABIST and BIST designs requiring these macro-test patterns, and then creates the TMD 208 with a sequence of functional test patterns at the product boundary IOs and scan-chain latches.

The MTR 200 defines the required isolation pins, and functional test patterns at the MABIST or BIST design boundary. These functional test patterns initialize the MABIST and BIST controllers, apply clock cycles to run them, and measure the resulting signature to determine if the SRAM and eDRAM macros function correctly. In addition to indicating failing SRAM and eDRAM macros, these patterns also measure data that specifies certain repairs to be made within the SRAM and eDRAM macros through the use of redundant rows and/or columns enabled with laser fuse blow. The TMD 208 and LPXREF dataset 210 are inputs to the Test Data Supply (TDS) software application 214 used to generate the ASIC's manufacturing test data, which is used for a TESTING 216 of the SRAM and eDRAM macros to determine failed memory addresses. The results of the TESTING 216 are use to blow the fuses by a LASER FUSER 236.

In the VIM 204, fuse macros are identified by a keyword. The FLD dataset 206 for a fuse macro includes information about the fuses in the fuse PROM for use by the fuse decompression macro. An example of a FLD 206 for a 64-word fuse PROM corresponds to FIG. 3 and is illustrated in FIG. 9, in accordance with embodiments of the present invention. The fuse PROM is identified by a keyword, FUSE_MACRO=YES, in its logical cell rule. The fuse decompression macro is identified by a keyword FUSE_DECOMPRESS=YES. The FLD 206, associated with the fuse PROM (by naming convention), contains two sections: the instructions section and the fuse location section. The instructions section of the FLD 206 begins with a "begin_instructions" record and ends with an "end_instructions" record, and has a series of keywords to steer the program. The FUSE_ALGORITHM value of FUSE_SHIFT_REG indicates that the fuse scenario in this design uses a fuse decompression macro. The PINNAME_SREG statement value gives the fuse decompression macro output data pin name at which tracing of the shift register begins. The KEY statement value indicates the algorithm to be used to build the first fuse macro record in the LPXREF dataset 210. The COMPRESSION_ALGORITHM statement value indicates the compression algorithm being used with this particular macro. The FUSE_WORDS statement value indicates how many words of fuses are contained within the fuse PROM. The fuse locations section of the FLD 206 begins with a "begin_xy_locations" record and ends with an "end_xy_location" record, and has, for each fuse, a line containing X-Y location and an identifier indicating the logical word and bit it represents. The X-Y location is the center of the fuse relative to the fuse macro's (0,0) point, in microns.

An example of a LLD 207 for an eDRAM is illustrated in FIG. 10, in accordance with embodiments of the present invention. The first section is the instructions section, which begins with a "begin_instructions" record and ends with an "end_instructions" record, and has a series of keywords to steer the program. The KEY statement indicates the type of shift-register macro encountered, how to build the LPXREF latch section for the shift register, and what algorithm is to be used in manufacturing. There are two possible KEY values: EDRAM and MABIST. There is no default value. If the KEY value is EDRAM, then a SIZE statement gives the number of megabytes of the eDRAM. The REPAIR_ALGORITHM statement gives the algorithm name to be used to repair the eDRAM in manufacturing, indicating how the failing addresses should be interpreted. The PINNAME_SREG statement gives the eDRAM shift register data output to be used when continuing the trace of the shift register to the next memory.

An example of a LLD 207 for a SRAM is illustrated in FIG. 11, in accordance with embodiments of the present invention. If the KEY value is MABIST, the PINNAME_PF statement gives the SRAM passfail output pin name to be used to trace to the SRAM's associated BIST controller. The PINNAME_SREG statement gives the SRAM shift register data output pin name to be used when continuing the trace of the shift register to the next memory. If the KEY value is MABIST, a second section must be present in the LLD 207. It describes the SRAM shift register latch correspondence to the SRAM's associated BIST controller latch. The latch names are ordered in the LLD 207 such that the first latch in the list is the latch positioned in the shift register closest to the fuse compression macro. The section begins with a "begin latches" record and ends with an "end latches" record.

The LPXREF_GEN program 212 reads in the entire ASIC design. If the design is hierarchical, it flattens it, creating flattened netlist names and transformed macro placement locations. The LPXREF_GEN program 212 then inspects each instance in the design to determine if said instance is a fuse decompression macro, by looking for the keyword/value FUSE_DECOMPRESS=YES in the logical rule. If the LPXREF_GEN program 212 finds a fuse decompression macro, then the LPXREF_GEN program 212 will trace out of pin SELECT00 through any passthrough books until it finds a fuse PROM. The system will then fetch and read the associated FLD 206. If the FLD 206 indicates that the FUSE_ALGORITHM is FUSE_SHIFT_REG, then the following steps are executed:

1) Create the first record "SECTION FUSE_SHIFT_REG;"

2) Create the second record (the fuse macro data record). Use the KEY value (DECOMP) from the FLD 206, the hierarchical macro instance name, and the cell name. Then, copy the COMPRESSION_ALGORITHM value into the record. Finally, read and store the value of the FUSE_WORDS keyword.

3) Then, for each record in the fuse section of the FLD 206, create a fuse location record, beginning with the label "FUSE". Copy the identified field from the FLD 207 record. Then transform the X-Y fuse location in the FLD 206 to chip-level X-Y coordinates, taking into account the fuse PROM's placement location, mirror and rotation data, as specified in the VIM 204 and include this transform data.

4) If there are connections to the other SELECTxx pins on the fuse decompression macro, trace the paths from those pins to other fuse PROMs in the design, continuing in an order such that SELECT01 is traced next, and then SELECT02 is traced after that and so on. The value in the fuse identifier field of FLD 206 is modified, such that the list of fuse identifiers in the resulting LPXREF 210 is unique. For example, when listing the fuses from the second PROM's FLD 206 (the PROM connected to SELECT01), the fuse identifier word0bit0 is changed to word64bit0, the fuse identifier word0bit11 is changed to word64bit11, . . . , and the fuse identifier word63bit11 is changed to word127bit11. Repeat step 3) for each fuse PROM connected to be a SELECTxx pin, using the total of the FUSE_WORDS keywords from each FLD 206 to calculate the offset to the identifier records found within the FLD 206.

5) Next create the fuse shift register records. Start tracing the fuse shift register, beginning at the fuse data output pin of the fuse decompression. The output pin name value is contained in the required statement type, PINNAME_SREG in the instructions portion of the FLD 206. Trace through any instances which are labeled as "pass-through" cells. Find the first macro in the shift register. It should have an associated LLD 207 dataset stored in the library. Read the LLD 207 dataset and do the following:

a) If the KEY statement has a value EDRAM, then create a shift register record by copying the KEY value, the SIZE value, and the REPAIR_ALGORITHM value from the LLD 207. Then copy in the hierarchical macro instance name and the cell name.

b) If the KEY statement has a value MABIST, trace from the SRAM macro to the BIST controller PFxx pin using the PINNAME_PF value from the LLD 207 as the SRAM output pin name to start the trace. Then create a shift register record for each latch record listed in the LLD 207. Copy in the KEY value (MABIST) from the LLD 207. Then include the hierarchical controller instance pass fail pin name, found in the trace from the SRAM pass fail pin. Create and include the hierarchical SRAM latch instance name and the hierarchical controller latch instance name, both formed by combining the hierarchical instance names of the SRAM and BIST macros, as described in the chip VIM database, with the latch names listed inside the LLD 207 latch record.

c) Read the PINNAME_SREG from the LLD 207 and, if there is a net attached to the macro instance shift register data out pin, then trace to the next macro and repeat steps a) through c).

When the shift register record creation is complete, it can be written to the LPXREF dataset 210 without changing the order of the records (1$^{st}$ latch in the shift register is listed first; last latch in the shift register is listed last). There will be one SECTION FUSE_SHIFT_REG for each fuse shift register found on chip.

An example of a LPXREF dataset 210 is illustrated in FIGS. 12A and 12B, in accordance with embodiments of the present invention, for a chip containing a decompression fuse macro, two fuse PROMs each PROM having 64 fuses, and a shift register with 2 MABIST instances and 1 eDRAM instance (in that order). FIG. 12A illustrates the fuse portion of the LPXREF dataset 210. FIG. 12B illustrates the memory portion of the LPXREF dataset 210.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A method for enabling a repair of defective memory in an integrated circuit design, said design having memory locations, redundant memory, and a central location for ordered fuses adapted to identify in compressed format defective sections of each of the memory locations, said defective sections comprising failed memory addresses and adapted to be replaced by sections of the redundant memory, said ordered fuses having a fuse bit pattern, said fuse bit pattern sequentially representing said defective sections in said compressed format, said method comprising:

determining the order in which the memory locations are wired together;

designing a shift register of latches through the memory locations in accordance with said order; and associating each of the latches with a corresponding bit of an uncompressed bit pattern from which said fuse bit pattern is derived, said uncompressed bit pattern sequentially representing said defective sections in uncompressed format.

2. The method of claim 1, wherein said associating comprises generating a logical-to-physical cross reference (LPXREF) dataset encoded within a first computer readable medium, said generating the LPXREF dataset comprising generating a fuse portion of the LPXREF dataset and generating a memory portion of the LPXREF dataset.

3. The method of claim 2, wherein the fuse portion of the LPXREF dataset comprises an array of fuse elements, the fuse elements respectively corresponding to the ordered fuses and ordered in correspondence to the ordered fuses, each fuse element comprising a fuse identifier and associated spatial coordinates of the corresponding fuse.

4. The method of claim 3, wherein the ordered fuses are comprised by at least one fuse macro, and wherein generating the fuse portion of the LPXREF dataset comprises:

providing a fuse location (FL) dataset for each fuse macro of the at least one fuse macro, said FL dataset being encoded within a second computer readable medium, said FL dataset comprising FL data that includes the fuse identifier and associated spatial coordinates of each fuse of each array of said fuse macro; and transferring the FL data of each FL dataset into the fuse portion of the LPXREF dataset.

5. The method of claim 2, wherein the memory portion of the LPXREF dataset comprises a sequence of memory data blocks ordered in accordance with the order in which the memory locations are wired together.

6. The method of claim 5, wherein the memory data blocks facilitate forming a sequence of address bits of the failed memory addresses of said defective sections, said sequence of address bits corresponding to said uncompressed bit pattern, said address bits derived from built-in self test (BIST) latches that comprise said address bits, said sequence of address bits ordered in accordance with a sequence of latches in the shift register and adapted to be compressed into said fuse bit pattern.

7. The method of claim 6,
wherein said memory locations comprise at least one random access memory (RAM),
wherein said BIST latches comprise at least one set of BIST latches such that each set of the at least one set of BIST latches corresponds to a unique RAM of said RAMs,
wherein each set of BIST latches is adapted to store the address bits of the failed memory addresses of the corresponding unique RAM of said RAMs as determined from BIST testing of the corresponding unique RAM of said RAMs,
wherein the latches of the shift register are a chained sequence of RAM latches extending through the RAMs of the at least one RAM in accordance with a sequential wiring path through the RAMs of the at least one RAM corresponding to the order in which the memory locations are wired together,
wherein the RAM latches in each RAM are in an ordered sequence and are adapted to subsequently receive the address bits stored in the set of BIST latches that corresponds to said RAM,
wherein each memory data block of the memory portion of the LPXREF dataset corresponds to one of said RAMs, and
wherein each memory data block facilitates placement of the address bits of the failed memory addresses of the corresponding one of said RAMs within said sequence of address bits adapted to be compressed into said fuse bit pattern.

8. The method of claim 7,
wherein the at least one RAM includes a first static random access memory (SRAM),
wherein the memory data block associated with the first SRAM is a first SRAM data block,
wherein the BIST latches associated with said first SRAM are located outside of said first SRAM,
wherein each RAM latch in the first SRAM is associated with a unique BIST latch of the BIST latches associated with the first SRAM such that each said RAM latch in the first SRAM is adapted to subsequently receive the address bit that is stored in its associated unique BIST latch,
wherein the first SRAM data block comprises first SRAM latch pointers and associated BIST latch pointers, and
wherein each said first SRAM latch pointer points to one of said RAM latches within said first SRAM and the associated BIST latch pointer points to the BIST latch that is uniquely associated with the one of said RAM latches so as to facilitate said placement.

9. The method of claim 8, wherein the first RAM latch pointers in the first SRAM data block are ordered in accordance with the chained sequence of the RAM latches within said first SRAM.

10. The method of claim 8, wherein generating the LPXREF dataset comprises:
providing a latch location (LL) dataset for the first SRAM, said LL dataset being encoded within a second computer readable medium, wherein the LL dataset for the first SRAM comprises LL data that includes the first SRAM latch pointers and associated BIST latch pointers; and
transferring the LL data of the LL dataset for the first SRAM into the first SRAM data block of the LPXREF dataset.

11. The method of claim 7,
wherein the at least one RAM includes a first embedded dynamic random access memory (eDRAM),
wherein the memory data block associated with the first eDRAM is a first eDRAM data block,
wherein the BIST latches associated with said first eDRAM are located inside the first eDRAM, and
wherein the first eDRAM data block comprises an identification of a first algorithm adapted to transfer the address bits stored in the BIST latches relating to said first eDRAM into the RAM latches in said first eDRAM,
wherein the first eDRAM data block further comprises an identification of the memory size of the first eDRAM, and
wherein said first algorithm utilizes said memory size of the first eDRAM to transfer the address bits stored in the BIST latches relating to said first eDRAM into the RAM latches in said first eDRAM so as to facilitate said placement of the address bits of the failed memory addresses of the corresponding one of said RAMs within said sequence of address bits adapted to be compressed into said fuse bit pattern.

12. The method of claim 11, wherein generating the LPXREF dataset comprises:
providing a latch location (LL) dataset for the first eDRAM, said LL dataset being encoded within a second computer readable medium, wherein the LL dataset for the first eDRAM comprises LL data that includes said identification of said first algorithm and said identification of said memory size of the first eDRAM; and
transferring the LL data of the LL dataset for the first eDRAM into the first eDRAM data block of the LPXREF dataset.

13. The method of claim 7, wherein the integrated circuit design comprises a semiconductor chip, said chip including said plurality of memory locations, said redundant memory, and said ordered fuses, said method further comprising:
fabricating the chip;
BIST testing each RAM of the chip to determine the failed memory addresses of each RAM such that the failed memory addresses so determined are stored in the BIST latches corresponding to each RAM;
forming said sequence of address bits extracted from the BIST latches of all RAMs in the chip, wherein forming said sequence includes ordering said address bits in accordance with the sequence of RAM latches in the shift register, said forming said sequence of address bits including utilizing the LPXREF dataset; and
compressing said sequence of address bits to form said fuse bit pattern;
burning the fuses denoted in the fuse portion of the LPXREF dataset in accordance with said fuse bit pattern such that the sequential ordering of the bits in said fuse bit pattern corresponds to the sequential ordering of fuses in the fuse portion of the LPXREF dataset.

14. The method of claim 13; further comprising:
powering up the chip; and
decompressing the sequentially ordered fuse bits to generate a decompressed bit string such that a sequential ordering of the bits in the decompressed bit string corresponds to the sequential ordering of the RAM latches in the shift register.

15. The method of claim 1, wherein a sequence of address bits of the failed memory addresses of said defective sections correspond to said uncompressed bit pattern, and wherein said sequence of address bits are ordered in accordance with a sequence of latches in the shift register and are configured to be compressed into said fuse bit pattern that is comprised by said ordered fuses and that sequentially represents said defective sections in said compressed format.

16. A system for enabling a repair of defective memory in an integrated circuit design, said design having memory locations, redundant memory, and a central location for ordered fuses adapted to identify in compressed format defective sections of each of the memory locations, said defective sections comprising failed memory addresses and adapted to be replaced by sections of the redundant memory, said ordered fuses having a fuse bit pattern, said fuse bit pattern sequentially representing said defective sections in said compressed format, said system comprising:
 a shift register of latches through the memory locations in accordance with an order in which the memory locations are wired together, wherein each latch of the shift register is associated with a sequentially corresponding bit of an uncompressed bit pattern from which the fuse bit pattern is derived, said uncompressed bit pattern sequentially representing said defective sections in uncompressed format.

17. The system of claim 16, further comprising a logical-to-physical cross reference (LPXREF) dataset and built-in self test (BIST) latches, wherein the LPXREF dataset is encoded within a first computer readable medium, and wherein the LPXREF dataset comprises a fuse portion and a memory portion.

18. The system of claim 17, wherein the fuse portion of the LPXREF dataset comprises an array of fuse elements, the fuse elements respectively corresponding to the ordered fuses and ordered in correspondence to the ordered fuses, each fuse element comprising a fuse identifier and associated spatial coordinates of the corresponding fuse.

19. The system of claim 18, further comprising:
 at least one fuse macro that includes the ordered fuses; and
 a fuse location (FL) dataset for each fuse macro of the at least one fuse macro, wherein the FL dataset is encoded within a second computer readable medium, wherein the FL dataset comprises FL data that includes the fuse identifier and associated spatial coordinates of each fuse of each array of said fuse macro, and wherein the FL data of each FL dataset is adapted to be transferred into the fuse portion of the LPXREF dataset.

20. The system of claim 17, wherein the memory portion of the LPXREF dataset comprises a sequence of memory data blocks ordered in accordance with the order in which the memory locations are wired together, wherein the memory data blocks facilitate forming a sequence of address bits of the failed memory addresses of said defective sections, said BIST latches storing said address bits, said address bits of the sequence of address bits adapted to be obtained from said BIST latches, said sequence of address bits ordered in accordance with the sequence of latches in the shift register and adapted to be compressed into said fuse bit pattern.

21. The system of claim 20,
 wherein said memory locations comprise at least one random access memory (RAM),
 wherein said BIST latches comprise at least one set of BIST latches such that each set of the at least one set of BIST latches corresponds to a unique RAM of said RAMs,
 wherein each set of BIST latches is adapted to store the address bits of the failed memory addresses of the corresponding unique RAM of said RAMs as determined from BIST testing of the corresponding unique RAM of said RAMs,
 wherein the latches of the shift register are a chained sequence of RAM latches extending through the RAMs of the at least one RAM in accordance with a sequential wiring path through the RAMs of the at least one RAM corresponding to the order in which the memory locations are wired together,
 wherein the RAM latches in each RAM are in an ordered sequence and are adapted to receive the address bits stored in the set of BIST latches that corresponds to said RAM,
 wherein each memory data block of the memory portion of the LPXREF dataset corresponds to one of said RAMs, and
 wherein each memory data block facilitates placement of the address bits of the failed memory addresses of the corresponding one of said RAMs within said sequence of address bits adapted to be compressed into said fuse bit pattern.

22. The system of claim 21,
 wherein the at least one RAM includes a first static random access memory (SRAM),
 wherein the memory data block associated with the first SRAM is a first SRAM data block,
 wherein the BIST latches associated with said first SRAM are located outside of said first SRAM,
 wherein each RAM latch in the first SRAM is associated with a unique BIST latch of the BIST latches associated with the first SRAM such that each said RAM latch in the first SRAM is adapted to receive the address bit that is stored in its associated unique BIST latch,
 wherein the first SRAM data block comprises first SRAM latch pointers and associated BIST latch pointers, and
 wherein each said first SRAM latch pointer points to one of said RAM latches within said first SRAM and the associated BIST latch pointer points to the BIST latch that is uniquely associated with the one of said RAM latches so as to facilitate said placement.

23. The system of claim 21, further comprising a latch location (LL) dataset for the first SRAM, wherein the LL dataset is encoded within a second computer readable medium, wherein the LL dataset for the first SRAM comprises LL data that includes the first SRAM latch pointers and associated BIST latch pointers, and wherein the LL data of the LL dataset for the first SRAM is adapted to be transferred into the first SRAM data block of the LPXREF dataset.

24. The system of claim 21,
 wherein the at least one RAM includes a first embedded dynamic random access memory (eDRAM),
 wherein the memory data block associated with the first eDRAM is a first eDRAM data block,
 wherein the BIST latches associated with said first eDRAM are located inside the first eDRAM, and
 wherein the first eDRAM data block comprises an identification of a first algorithm adapted to transfer the address bits stored in the BIST latches relating to said first eDRAM into the RAM latches in said first eDRAM, wherein the first eDRAM data block further comprises an identification of the memory size of the first eDRAM, and wherein said first algorithm utilizes said memory size of the first eDRAM to transfer the address bits stored in the BIST latches relating to said first eDRAM into the RAM latches in said first eDRAM.

25. The system of claim 24, further comprising a latch location (LL) dataset for the first eDRAM, wherein the LL dataset is encoded within a second computer readable medium, wherein the LL dataset for the first eDRAM comprises LL data that includes said identification of said first algorithm and said identification of said memory size of the first eDRAM, and wherein the LL data of the LL dataset for the first eDRAM is adapted to be transferred into the first eDRAM data block of the LPXREF dataset.

26. The system of claim 16, wherein a sequence of address bits of the failed memory addresses of said defective sections correspond to said uncompressed bit pattern, and wherein said sequence of address bits are ordered in accordance with a sequence of latches in the shift register and are configured to be compressed into said fuse bit pattern that is comprised by said ordered fuses and that sequentially represents said defective sections in said compressed format.

* * * * *